(12) United States Patent
Wang et al.

(10) Patent No.: US 10,337,498 B2
(45) Date of Patent: Jul. 2, 2019

(54) METHOD AND DEVICE FOR DETECTING EQUIVALENT LOAD OF WIND TURBINE

(71) Applicant: BEIJING GOLDWIND SCIENCE & CREATION WINDPOWER EQUIPMENT CO., LTD., Beijing (CN)

(72) Inventors: Minghui Wang, Beijing (CN); Bo Juul Pedersen, Hadsten (DK); Jian Li, Beijing (CN)

(73) Assignee: Beijing Goldwind Science & Creation Windpower Equipment Co., Ltd., Beijing (CN)

( * ) Notice: Subject to any disclaimer, the term of this patent is extended or adjusted under 35 U.S.C. 154(b) by 0 days.

(21) Appl. No.: 15/759,335

(22) PCT Filed: Jun. 9, 2017

(86) PCT No.: PCT/CN2017/087671
§ 371 (c)(1),
(2) Date: Mar. 12, 2018

(87) PCT Pub. No.: WO2018/103286
PCT Pub. Date: Jun. 14, 2018

(65) Prior Publication Data
US 2019/0072075 A1    Mar. 7, 2019

(30) Foreign Application Priority Data

Dec. 5, 2016  (CN) .......................... 2016 1 1101888

(51) Int. Cl.
*F03D 7/04*    (2006.01)
*F03D 17/00*   (2016.01)
(Continued)

(52) U.S. Cl.
CPC ............... *F03D 7/046* (2013.01); *F03D 7/00* (2013.01); *F03D 17/00* (2016.05);
(Continued)

(58) Field of Classification Search
USPC ............... 290/44, 55; 705/7.22, 7.24, 37, 85
See application file for complete search history.

(56) References Cited

U.S. PATENT DOCUMENTS 4,977,527 A * 12/1990 Shaw ..................... G08B 17/10
340/515
7,889,019 B2 * 2/2011 Gizara .................... G06F 1/025
327/172

(Continued)

FOREIGN PATENT DOCUMENTS

CN    103742359 A    4/2014
CN    105041572 A    11/2015
(Continued)

OTHER PUBLICATIONS

International Search Report issued in International Application No. PCT/2017/087671, mailed from the State Intellectual Property Office of China dated Aug. 18, 2017.
(Continued)

*Primary Examiner* — Pedro J Cuevas
(74) *Attorney, Agent, or Firm* — Finnegan, Henderson, Farabow, Garrett & Dunner, LLP

(57) ABSTRACT

A method and device for detecting equivalent load of wind turbine are provided. The method includes: detecting environment data of each wind turbine of multiple wind turbines in wind farm in each detection period; and in each detection period, detecting load of one or more calibration wind turbines in the multiple wind turbines, calculating equivalent load of the calibration wind turbines based on detected load, and determining equivalent load of each wind turbine based
(Continued)

on detected environment data of each wind turbine with load estimation model, where load estimation model represents relation between environment data and equivalent load of wind turbine, and before load estimation model is applied in each detection period, parameter of load estimation model is calibrated based on the equivalent load calculated in current detection period and the equivalent load of the calibration wind turbines determined with load estimation model in previous detection period.

19 Claims, 3 Drawing Sheets

(51) Int. Cl.
  *G06F 17/50* (2006.01)
  *F03D 7/00* (2006.01)
  *G06F 19/00* (2018.01)
(52) U.S. Cl.
  CPC .......... *G06F 17/5086* (2013.01); *G06F 19/00* (2013.01); *F05B 2270/32* (2013.01); *F05B 2270/321* (2013.01); *Y02E 10/723* (2013.01)

(56) References Cited

U.S. PATENT DOCUMENTS

| | | | | |
|---|---|---|---|---|
| 7,961,023 B2* | 6/2011 | Gizara | ................ | H02M 3/157 323/223 |
| 8,633,607 B2* | 1/2014 | Egedal | ................ | F03D 7/0292 290/44 |
| 8,661,442 B2* | 2/2014 | Dantzig | ................ | G06Q 40/04 718/101 |
| 9,018,782 B2* | 4/2015 | Couchman | .............. | F03D 7/028 290/44 |
| 9,098,876 B2* | 8/2015 | Steven | ............... | G06Q 30/0283 |
| 9,367,825 B2* | 6/2016 | Steven | ................... | G06Q 10/00 |
| 9,551,322 B2 | 1/2017 | Ambekar et al. | | |
| 9,705,327 B2* | 7/2017 | Rombouts | .............. | G05B 17/02 |
| 9,727,071 B2* | 8/2017 | Steven | ................... | G06Q 50/06 |
| 2009/0180875 A1 | 7/2009 | Egedal et al. | | |
| 2010/0271097 A1* | 10/2010 | Gizara | ................. | H02M 3/157 327/172 |
| 2011/0018271 A1 | 1/2011 | Karikomi et al. | | |
| 2013/0140819 A1* | 6/2013 | Abdallah | .............. | F03D 7/0224 290/44 |
| 2013/0161949 A1* | 6/2013 | Egedal | ................. | F03D 7/0292 290/44 |
| 2013/0214534 A1* | 8/2013 | Nakamura | ................ | F03D 7/00 290/44 |
| 2013/0245847 A1* | 9/2013 | Steven | ................... | G06Q 50/06 700/291 |
| 2013/0255363 A1 | 10/2013 | Merida et al. | | |
| 2013/0257051 A1* | 10/2013 | Spruce | ................... | F03D 7/028 290/44 |
| 2013/0270827 A1* | 10/2013 | Couchman | .............. | F03D 7/028 290/44 |
| 2013/0346139 A1* | 12/2013 | Steven | ................... | G06Q 10/00 705/7.24 |
| 2014/0006331 A1 | 1/2014 | Bai et al. | | |
| 2014/0122320 A1* | 5/2014 | Dantzig | ................. | G06Q 40/04 705/37 |
| 2014/0284926 A1* | 9/2014 | Tirumalai | ............. | F03D 7/0204 290/44 |
| 2014/0330695 A1* | 11/2014 | Steven | ............... | G06Q 30/0283 705/37 |
| 2015/0088576 A1* | 3/2015 | Steven | ................... | G06Q 50/06 705/7.22 |
| 2015/0176569 A1 | 6/2015 | Karikomi et al. | | |
| 2015/0308416 A1 | 10/2015 | Ambekar et al. | | |
| 2016/0006248 A1* | 1/2016 | Sakuma | .................... | H02J 3/46 307/48 |
| 2016/0084233 A1 | 3/2016 | Evans et al. | | |
| 2016/0146190 A1 | 5/2016 | Ravindra et al. | | |
| 2016/0190805 A1* | 6/2016 | Steven | ............... | G06Q 30/0283 700/291 |
| 2017/0126009 A1* | 5/2017 | Chen | ....................... | H02J 3/381 |
| 2017/0317495 A1* | 11/2017 | Pavlovski | .............. | G01R 22/00 |
| 2018/0107503 A1* | 4/2018 | Machida | ................... | G06F 9/50 |
| 2018/0314949 A1* | 11/2018 | Bender | .................. | G06N 5/022 |
| 2019/0005826 A1* | 1/2019 | Lax | ........................ | G01C 21/20 |

FOREIGN PATENT DOCUMENTS

| | | |
|---|---|---|
| CN | 105320785 A | 2/2016 |
| CN | 105508149 A | 4/2016 |
| CN | 105701337 A | 6/2016 |
| CN | 105760641 A | 7/2016 |
| JP | 2016-35208 A | 3/2016 |
| WO | WO 2016/188532 A1 | 12/2016 |

OTHER PUBLICATIONS

Examination Report No. 1 issued in corresponding Australian Application No. 2017317610, dated Mar. 7, 2019.
First Office Action issued in corresponding Chinese Application No. 201611101888.3, dated Apr. 3, 2019.

\* cited by examiner

METHOD AND DEVICE FOR DETECTING EQUIVALENT LOAD OF WIND TURBINE

The present application is the national phase of International Application No. PCT/CN2017/087671, titled "METHOD AND DEVICE FOR DETECTING EQUIVALENT LOAD OF WIND TURBINE", and filed on Jun. 9, 2017, which claims the priority to Chinese Patent Application No. 201611101888.3, titled "METHOD AND DEVICE FOR DETECTING EQUIVALENT LOAD OF WIND TURBINE", filed on Dec. 5, 2016 with the State Intellectual Property Office of the People's Republic of China, which are incorporated herein by reference in their entireties.

TECHNICAL FIELD

The present disclosure relates to the field of wind power generation, and particularly to a method and a device for detecting an equivalent load of a wind turbine.

BACKGROUND

As a kind of clean and renewable energy, wind energy has attracted increasing attention, and installed capacity keeps increasing. With the continuous development in the wind power technology, estimation of fatigue life of a wind turbine has also attracted increasing attention. To estimate the fatigue life of the wind turbine, an equivalent load on the wind turbine needs to be obtained.

Generally, for equivalent load detection, a sensor needs to be arranged for the wind turbine to acquire original load data, and the equivalent load is calculated based on the original load data. In practice, in this technology, the sensor needs to be arranged for each wind turbine, which leads to a high cost. Or, by building a database including a large amount of detection data and equivalent loads in advance, the equivalent load is determined by searching the database for an equivalent load matched with detected data. However, such a technology has a low detection accuracy.

SUMMARY

The present disclosure is to provide a method and a device for detecting an equivalent load of a wind turbine.

According to an aspect of the present disclosure, a method for detecting an equivalent load of a wind turbine is provided. The method includes: detecting environment data of each wind turbine of multiple wind turbines in a wind farm in each detection period; detecting a load of a calibration wind turbine in the multiple wind turbines and calculating an equivalent load of the calibration wind turbine based on the detected load in the each detection period; and determining an equivalent load of the each wind turbine based on the detected environment data of the each wind turbine with a load estimation model in the each detection period, where the load estimation model represents a relation between the environment data and the equivalent load of the each wind turbine, and before the load estimation model is applied in the each detection period, a parameter of the load estimation model is calibrated based on the calculated equivalent load of the calibration wind turbine in a current detection period and the equivalent load of the calibration wind turbine determined with the load estimation model in a previous detection period.

According to another aspect of the present disclosure, a device for detecting an equivalent load of a wind turbine is provided. The device includes: a first detecting unit, configured to detect environment data of each wind turbine of multiple wind turbines in a wind farm in each detection period; a second detecting unit, configured to detect a load of a calibration wind turbine in the multiple wind turbines and calculate an equivalent load of the calibration wind turbine based on the detected load in the each detection period; and an estimation unit, configured to determine an equivalent load of the each wind turbine based on the detected environment data of the each wind turbine with a load estimation model in the each detection period, where the load estimation model represents a relation between the environment data and the equivalent load of the each wind turbine, and before the load estimation model is applied in the each detection period, the estimation unit calibrates a parameter of the load estimation model based on the calculated equivalent load of the calibration wind turbine in a current detection period and the equivalent load of the calibration wind turbine determined with the load estimation model in a previous detection period.

According to another aspect of the present disclosure, a method for estimating fatigue life of a wind turbine is provided. The method includes: detecting an equivalent load of the wind turbine based on the method for detecting the equivalent load of the wind turbine described above; and estimating the fatigue life of the wind turbine based on the detected equivalent load.

According to another aspect of the present disclosure, an apparatus for estimating fatigue life of a wind turbine is provided. The apparatus includes: the device for detecting the equivalent load of the wind turbine described above, configured to detect an equivalent load of the wind turbine; and a prediction unit, configured to estimate the fatigue life of the wind turbine based on the equivalent load detected by the device.

According to another aspect of the present disclosure, a computer-readable storage medium is provided. The storage medium has a computer program stored therein, where the computer program, when being executed, performs the method.

BRIEF DESCRIPTION OF THE DRAWINGS

In order to illustrate technical solutions in embodiments of the present disclosure more clearly, drawings used in the description of the embodiments are introduced briefly hereinafter.

DETAILED DESCRIPTION OF EMBODIMENTS

Figure 1:
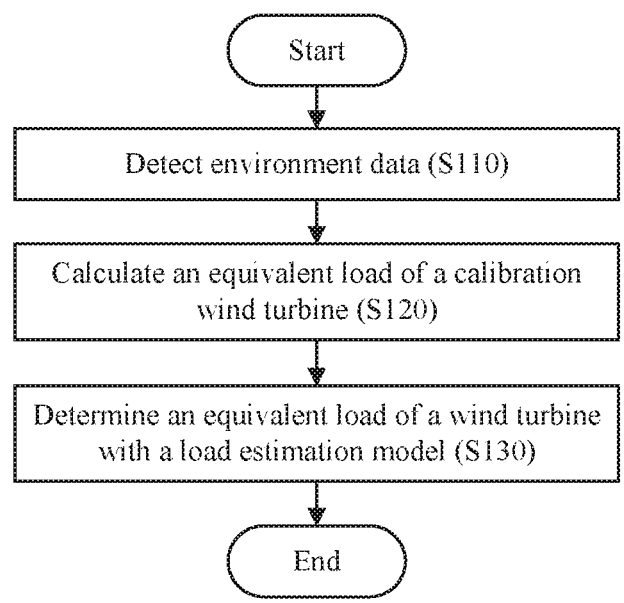
FIG. 1 is a flow chart of a process of a method for detecting an equivalent load of a wind turbine according to an embodiment of the present disclosure executed in one detection period.

Reference is made to FIG. 1, which is a flow chart of a process of a method for detecting an equivalent load of a wind turbine according to an embodiment of the present disclosure executed in one detection period.

In step S110, environment data of each wind turbine of multiple wind turbines in a wind farm is detected. Various kinds of environment data that have influence on a load of a wind turbine may be adopted. In a preferred embodiment of the present disclosure, the environment data of any of the wind turbines includes at least one of effective turbulence intensity and wind farm influence information. In the present disclosure, the effective turbulence intensity indicates turbulence intensity directly experienced by an impeller of the any of the wind turbines, and the wind farm influence information indicates an influence factor on the any of the wind turbines by the wind farm. With the environment data provided in the preferred embodiment of the present disclosure, more accurate detection may be achieved.

In step S120, a load of a calibration wind turbine in the multiple wind turbines is detected, and an equivalent load (which is also referred to as a damage equivalent load, an equivalent fatigue load and so on) of the calibration wind turbine is calculated based on the detected load.

In the embodiment, a part (for example, one or more) of the wind turbines in the wind farm may be determined as the calibration wind turbine for calibrating a parameter of a load estimation model described hereinafter.

For example, the load of the calibration wind turbine may be detected via a sensor arranged on some key components in a load transfer path of the calibration wind turbine. Or, a simulation result of loads of some key components of the calibration wind turbine may be determined as the load of the calibration wind turbine. These implementations are only for illustration, and the load of the calibration wind turbine may be detected based on various technologies. After the load of the calibration wind turbine is detected, the equivalent load of the calibration wind turbine may be calculated based on the detected load.

In step S130, an equivalent load of the each wind turbine is determined based on the detected environment data of the each wind turbine with the load estimation model. The load estimation model represents a relation between the environment data and the equivalent load of the each wind turbine. By taking the environment data as an input to the load estimation model, the load estimation model may output the equivalent load based on the input.

The load estimation model may be built in advance based on various technologies for establishing a correlation between variables, such as fitting, regression analysis, machine learning, self-adapting filter or the like.

For the effective turbulence intensity and the wind farm influence information adopted in the present disclosure, preferably, the load estimation model is built based on a recursive least squares (RLS) self-adapting filer, to acquire higher accuracy in a case that the effective turbulence intensity and the wind farm influence information are adopted. In a case that a self-adapting filter is applied, the load estimation model corresponds to a parameter variable filter (variable filter) in the self-adapting filter.

Before determining the equivalent load of the each wind turbine with the load estimation model, the parameter of the load estimation model is calibrated based on the equivalent load of the calibration wind turbine calculated in step S120 in a current detection period and the equivalent load of the calibration wind turbine determined with the load estimation model in step S130 in a previous detection period. Examples include: in a case that regression analysis is adopted, a regression coefficient is calibrated; and in a case that the self-adapting filter is adopted, a parameter of the parameter variable filter is calibrated.

In an embodiment, the equivalent load of the calibration wind turbine calculated in step S120 in the current detection period may be taken as a reference, and the equivalent load of the calibration wind turbine determined with the load estimation model in step S130 in the previous detection period may be taken as a feedback, to calibrate the parameter of the load estimation model.

In a case of applying the self-adapting filter to build the load estimation model, the parameter of the load estimation model may be calibrated with a corresponding self-adapting algorithm (for example, with a recursive least squares method in a case of adopting a recursive least squares self-adapting filer) based on a difference between the equivalent load of the calibration wind turbine calculated in the current detection period and the equivalent load of the calibration wind turbine determined with the load estimation model in the previous detection period.

In addition, for a first detection period, since there is no equivalent load of the calibration wind turbine determined with the load estimation model in a previous detection period, the parameter of the load estimation model may not be calibrated. Or, the equivalent load of the calibration wind turbine determined with the load estimation model in the first detection period may be adopted to replace the equivalent load of the calibration wind turbine determined with the load estimation model in the previous detection period.

Based on the method for detecting the equivalent load of the wind turbine according to the present disclosure, there is no need to arrange a sensor for each wind turbine, thus lowering a cost caused by arranging the sensor for each wind turbine. In addition, a part of the wind turbines in the wind farm are taken as the calibration wind turbine. In this way, as iterative detection proceeds, the load estimation model is adjusted and optimized continuously, the uncertainty decreases, the detection accuracy increases, and the detected equivalent load approaches an equivalent load acquired by simply using the sensor.

The sequence of performing step S120 and step S130 shown in FIG. 1 is not limited in the embodiment. Step S120 and step S130 may be performed simultaneously or successively.

An embodiment of detecting the effective turbulence intensity is described hereinafter with a reference to FIG. 2.

Figure 2:
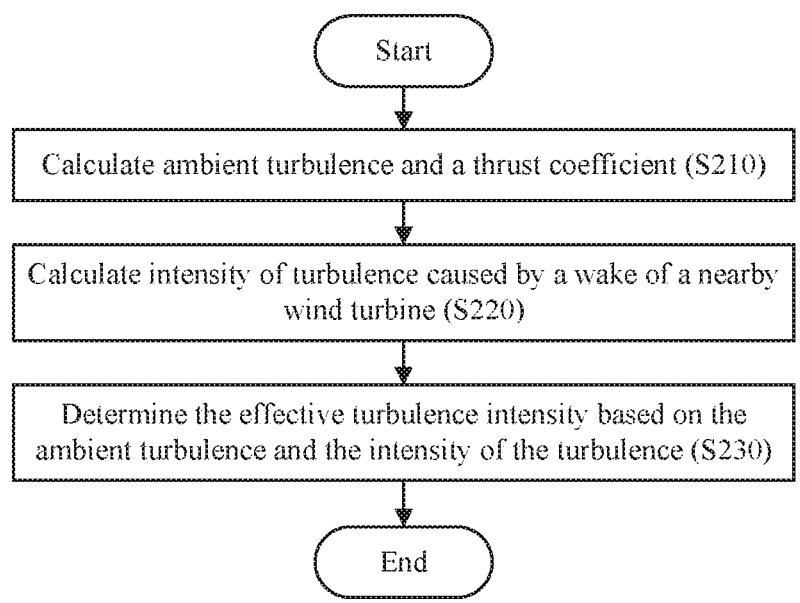
FIG. 2 is a flow chart of a method for detecting effective turbulence intensity of a wind turbine according to an embodiment of the present disclosure.

FIG. 2 is a flow chart of a method for detecting the effective turbulence intensity of the any of the wind turbines according to an embodiment of the present disclosure.

In step S210, ambient turbulence and a thrust coefficient of any of the wind turbines under an ambient wind speed are calculated based on the ambient wind speed.

In this case, the ambient wind speed needs to be detected in each period. The ambient wind speed is a wind speed of an ambient wind which is not influenced by a wind turbine (for example, it may be represented by a wind speed of a wind before the wind enters into a wind farm). As an example, the ambient wind speed may be obtained via an anemometer tower of the wind farm.

The thrust coefficient corresponding to the ambient wind speed may be calculated based on the conventional technology.

In an embodiment, the ambient turbulence may be a ratio of a standard deviation of the ambient wind speed to a mean value of the ambient wind speed. In another embodiment, the ambient turbulence is acquired based on the ambient wind speed, an ambient wind direction, and historical meteorological data of a surrounding environment of the wind farm, which will be described in detail hereinafter. In addition, the ambient turbulence may also be calculated according to the conventional technology, which is not described herein.

In step S220, intensity of turbulence caused by a wake of a nearby wind turbine is calculated based on the calculated thrust coefficient, the ambient wind speed, and a distance between the any of the wind turbines and the nearby wind turbine.

Intensity of turbulence caused by a wake of a wind turbine may be calculated base on various conventional wake models (for example, a Frandsen Model).

In a preferred embodiment, the nearby wind turbine is a wind turbine, from wind turbines located in an upwind direction of the ambient wind of the any of the wind turbines, which has a minimum distance from the any of the wind turbines, or multiple wind turbines located within a sector of the upwind direction of the ambient wind of the any of the wind turbine. In this case, the ambient wind direction needs to be detected in each period, to determine the upwind direction of the ambient wind of the wind turbine. The ambient wind direction is a wind direction of the ambient wind which is not influenced by a wind turbine (for example, it may be represented by a wind direction of a wind before the wind enters into the wind farm). As an example, the ambient wind direction may be obtained via an anemometer tower of the wind farm.

In step S230, the effective turbulence intensity is generated by synthesizing the ambient turbulence calculated in step S210 and the intensity of turbulence calculated in the step S220.

To generate the effective turbulence intensity, synthesis or superposition may be performed on the ambient turbulence and the intensity of the turbulence, and the synthesis or superposition reflects respective influences of the ambient turbulence and the intensity of the turbulence. For example, the effective turbulence intensity may be a sum of squares, a square root of the sum of the squares, a sum of absolute vales, and so on, of the ambient turbulence and the calculated intensity of the turbulence, which are not to limit the invention.

An embodiment of detecting the wind farm influence information is described in detail hereinafter.

In an embodiment of the present disclosure, the wind farm influence information may include at least one of a wake superposition degree and a wake superposition number.

In the embodiment, the wake superposition number indicates the number of other wind turbines having influence on a wake of the any of the wind turbines. Preferably, the wake superposition number indicates the number of other wind turbines located in the upwind direction of the ambient wind of the any of the wind turbines.

The wake superposition degree indicates a degree of influence on the any of the wind turbines by the wakes of the other wind turbines. Preferably, the influence may be represented by a ratio of an angle of the ambient wind direction to a sum of spread angles of wakes of the other wind turbines located in the upwind direction of the ambient wind of the any of the wind turbines. The present disclosure is not limited to the above descriptions, any other parameter that can reflect the degree of the influence on the any of the wind turbines by the wakes of the other wind turbines may also be adopted.

Additionally, the wake superposition degree and the wake superposition number may be adjusted by further considering the influence of the other wind turbines in the wind farm. Specifically, a regulation coefficient may be applied (for example, multiplying the wake superposition degree by the regulation coefficient) to the wake superposition degree (for example, the ratio). And normalization may be performed on the wake superposition number. That is, the adjusted wake superposition degree is a result of applying the regulation coefficient to the wake superposition degree (for example, the ratio), and the adjusted wake superposition number is a result of performing the normalization on the wake superposition number.

In the embodiment, the regulation coefficient is a ratio of a first distance to a second distance. The first distance indicates a minimum distance from distances between the any of the wind turbines and the other wind turbines located in the upwind direction of the ambient wind of the any of the wind turbines. The second distance indicates a maximum distance from the distances between the any of the wind turbines and the other wind turbines located in the upwind direction of the ambient wind of the any of the wind turbines.

Preferably, all the distances described above each are a relative distance that is dimensionless, for example, a dimensionless distance measured by taking a diameter of an impeller as a basic unit.

Based on the above embodiments of the present disclosure, by detecting the ambient wind speed and the ambient wind direction in the each detection period, the detection of the environment data is achieved, thereby detecting the equivalent load of the wind turbine precisely and lowering the detection cost effectively.

A method for acquiring the ambient turbulence based on the ambient wind speed, the ambient wind direction and the historical meteorological data of the surrounding environment of the wind farm in step S210 is described in detail hereinafter in conjunction with FIG. 3.

Figure 3:
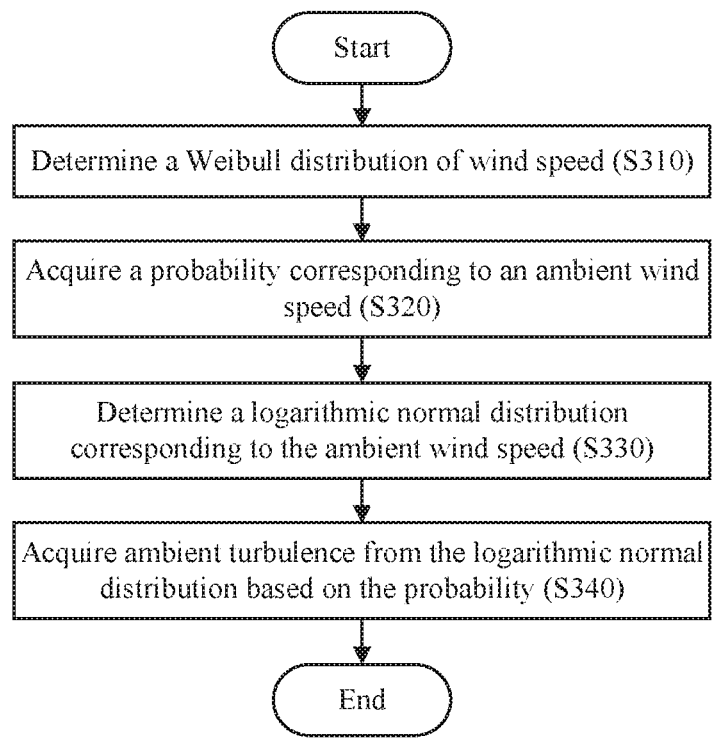
FIG. 3 is a flow chart of a method for detecting ambient turbulence according to an embodiment of the present disclosure.

FIG. 3 is a flow chart of a method for detecting the ambient turbulence according to an embodiment of the present disclosure.

In step S310, a Weibull distribution of wind speed is determined based on the historical meteorological data of the surrounding environment of the wind farm. The Weibull distribution of wind speed may be acquired based on historical environment data of a wind speed around the wind farm. A probability function of the Weibull distribution is mainly determined by a proportionality factor and a shape factor. Accordingly, the proportionality factor and the shape factor of the probability function may be determined. In this case, a curve of wind speed versus probability may be obtained.

In step S320, a probability corresponding to the ambient wind speed is acquired from the determined Weibull distribution based on the ambient wind speed.

In step S330, a logarithmic normal distribution of the ambient turbulence corresponding to the ambient wind speed is determined. The ambient turbulence under different wind speeds follows a specific logarithmic normal distribution. That is, the ambient turbulence under different wind speeds satisfies a corresponding logarithmic normal distribution. Different logarithmic normal distributions of the ambient turbulence under different wind speeds may be determined first. The logarithmic normal distribution of the ambient turbulence under the current ambient wind speed may be obtained when the ambient wind speed is acquired.

In step S340, the ambient turbulence is acquired from the determined logarithmic normal distribution based on the determined probability. In step S330, the logarithmic normal distribution of the ambient turbulence under the current ambient wind speed is obtained, i.e., a relation between the ambient turbulence and the probability is acquired. Hence, the ambient turbulence corresponding to the probability determined in the S320 is determined. For example, in a case that the logarithmic normal distribution of the ambient turbulence corresponding to the ambient wind speed is obtained, an inverse function of a function corresponding to the logarithmic normal distribution may be acquired, and an output of the inverse function is the ambient turbulence by taking the determined probability as an input of the inverse function.

A device for detecting an equivalent load of a wind turbine according to an embodiment of the present disclosure is described in detail hereinafter with a reference to FIG. 4.

Figure 4:
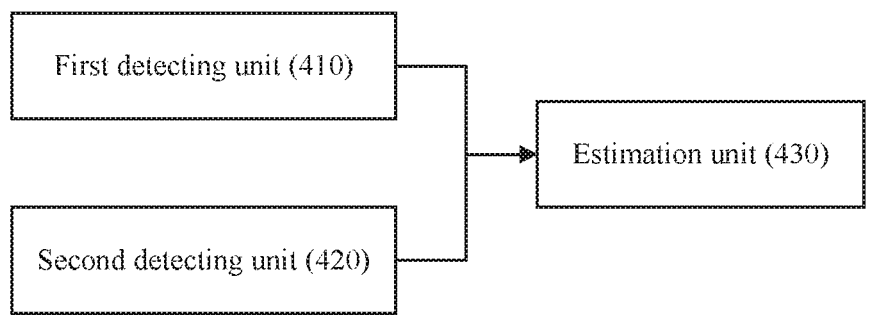
FIG. 4 is a block diagram of a device for detecting an equivalent load of a wind turbine according to an embodiment of the present disclosure.

FIG. 4 is a block diagram of a device for detecting an equivalent load of a wind turbine according to an embodiment of the present disclosure.

As shown in FIG. 4, the device 400 for detecting the equivalent load of the wind turbine according to an embodiment of the present disclosure includes: a first detecting unit 410, a second detecting unit 420 and an estimation unit 430.

The device 400 detects the equivalent load of the wind turbine periodically.

The first detecting unit 410 detects environment data of each wind turbine of multiple wind turbines in a wind farm in each detection period. In a preferred embodiment of the present disclosure, the environment data of any of the wind turbines includes at least one of effective turbulence intensity and wind farm influence information. In the present disclosure, the effective turbulence intensity indicates turbulence intensity directly experienced by an impeller of the any of the wind turbines, and the wind farm influence information indicates an influence factor on the any of the wind turbines by the wind farm. With the environment data provided in the preferred embodiment of the present disclosure, more accurate detection may be achieved.

In an embodiment, the first detecting unit 410 may detect the effective turbulence intensity of any of the wind turbines in a manner shown in FIG. 2. In this case, an ambient wind speed needs to be detected in each period. The ambient wind speed is a wind speed of an ambient wind which is not influenced by a wind turbine (for example, it may be represented by a wind speed of a wind before the wind enters into a wind farm). As an example, the ambient wind speed may be obtained via an anemometer tower of the wind farm.

A thrust coefficient corresponding to the ambient wind speed may be calculated according to the conventional technology.

In an embodiment, an ambient turbulence may be a ratio of a standard deviation of the ambient wind speed to a mean value of the ambient wind speed. In another embodiment, the first detecting unit 410 may acquire the ambient turbulence based on the ambient wind speed, the ambient wind direction, and historical meteorological data of a surrounding environment of the wind farm. For example, the first detecting unit 410 may acquire the ambient turbulence based on the ambient wind speed, the ambient wind direction and the historical meteorological data of the surrounding environment of the wind farm in a manner shown in FIG. 3. In addition, the first detecting unit 410 may also calculate the ambient turbulence according to the conventional technology, which is not described herein.

An embodiment of detecting the wind farm influence information by the first detecting unit 410 is described in detail hereinafter.

In an embodiment of the present disclosure, the wind farm influence information may include at least one of a wake superposition degree and a wake superposition number.

In the embodiment, the wake superposition number indicates the number of other wind turbines having influence on a wake of the any of the wind turbines. Preferably, the wake superposition number indicates the number of other wind turbines located in an upwind direction of the ambient wind of the any of the wind turbines.

The wake superposition degree indicates a degree of influence on the any of the wind turbines by the wakes of the other wind turbines. Preferably, the influence may be represented by a ratio of an angle of the ambient wind direction to a sum of spread angles of wakes of the other wind turbines located in the upwind direction of the ambient wind of the any of the wind turbines. The present disclosure is not limited to the above descriptions, any other parameter that can reflect the degree of the influence on the any of the wind turbines by the wakes of the other wind turbines may also be adopted.

Additionally, the first detecting unit 410 may adjust the wake superposition degree and the wake superposition number by further considering the influence of the other wind turbines in the wind farm. Specifically, the first detecting unit 410 may apply a regulation coefficient (for example, multiplying the wake superposition degree by the regulation coefficient) to the wake superposition degree (for example, the ratio), and perform normalization on the wake superposition number. That is, the adjusted wake superposition degree is a result of applying the regulation coefficient to the wake superposition degree (for example, the ratio), and the adjusted wake superposition number is a result of performing the normalization on the wake superposition number.

In the embodiment, the regulation coefficient is a ratio of a first distance to a second distance. The first distance indicates a minimum distance from distances between the any of the wind turbines and the other wind turbines located in the upwind direction of the ambient wind of the any of the wind turbines. The second distance indicates a maximum distance from the distances between the any of the wind turbines and the other wind turbines located in the upwind direction of the ambient wind of the any of the wind turbines.

Preferably, all the distances described above each are a relative distance that is dimensionless, for example, a dimensionless distance measured by taking a diameter of an impeller as a basic unit.

Based on the above embodiments of the present disclosure, by detecting the ambient wind speed and the ambient wind direction in the each detection period, the detection of the environment data is achieved, thereby detecting the equivalent load of the wind turbine precisely and lowering the detection cost effectively The second detecting unit 420 detects a load of one or more calibration wind turbines in the multiple wind turbines and calculates an equivalent load of the calibration wind turbines based on the detected load in the each detection period. In the embodiment, a part (for example, one or more of the wind turbines in the wind farm may be determined as the calibration wind turbines, for calibrating a parameter of a load estimation model described hereinafter.

For example, the load of the calibration wind turbines may be detected via a sensor arranged on some key components in a load transfer path of the calibration wind turbines. Or, a simulation result of loads of some key components of the calibration wind turbines may be determined as the load of the calibration wind turbines. It can be understood that, these implementations are only for illustration, and the load of the calibration wind turbines may be detected based on various technologies.

The estimation unit 430 determines an equivalent load of the each wind turbine based on the detected environment data of the each wind turbine with the load estimation model in the each detection period. The load estimation model represents a relation between the environment data and the equivalent load of the each wind turbine. In this way, the environment data may be taken as an input to the load estimation model, and the load estimation model may output the equivalent load based on the input.

The load estimation model may be built in advance based on various technologies for establishing a correlation between variables, such as fitting, regression analysis, machine learning, self-adapting filter or the like.

For the effective turbulence intensity and the wind farm influence information adopted in the present disclosure, preferably, the load estimation model is built based on a recursive least squares (RLS) self-adapting filer to acquire higher accuracy in a case that the effective turbulence intensity and the wind farm influence information are adopted. In a case that a self-adapting filter is applied, the load estimation model corresponds to a parameter variable filter (variable filter) in the self-adapting filter.

Before determining the equivalent load of the each wind turbine with the load estimation mode, the estimation unit 430 calibrates the parameter of the load estimation model based on the equivalent load of the calibration wind turbines calculated by the second detecting unit 420 in a current detection period and the equivalent load of the calibration wind turbines determined with the load estimation model by the estimation unit 430 in a previous detection period. Examples include: in a case of adopting regression analysis, a regression coefficient is calibrated and in a case of adopting the self-adapting filter, a parameter of the parameter variable filter is calibrated.

In an embodiment, the equivalent load of the calibration wind turbines calculated by the second detecting unit 420 in the current detection period may be taken as a reference, and the equivalent load of the calibration wind turbines determined with the load estimation model by the estimation unit 430 in the previous detection period may be taken as a feedback, to calibrate the parameter of the load estimation model.

In a case of adopting the self-adapting filter to build the load estimation model, the parameter of the load estimation model may be calibrated with a corresponding self-adapting algorithm (for example, with a recursive least squares method in a case of adopting a recursive least squares self-adapting filer) based on a difference between the equivalent load of the calibration wind turbines calculated in the current detection period and the equivalent load of the calibration wind turbines determined with the load estimation model in the previous detection period.

In addition, for a first detection period, since there is no equivalent load of the calibration wind turbines determined with the load estimation model in a previous detection period, the parameter of the load estimation model may not be calibrated. Or, the equivalent load of the calibration wind turbines determined with the load estimation model in the first detection period may be adopted as a replacement.

In addition, in another embodiment of the present disclosure, the method for detecting the equivalent load of the wind turbine according to the embodiments of the present disclosure may be applied to detecting an equivalent load of a wind turbine. Then, fatigue life of the wind turbine is estimated based on the detected equivalent load. The conventional fatigue life technology based on an equivalent load may be adopted, which is not described herein.

In addition, in another embodiment of the present disclosure, an apparatus for estimating fatigue life of a wind turbine is provided. The apparatus may include the device for detecting the equivalent load of the wind turbine according to the embodiments of the present disclosure, and a prediction unit. The device may detect an equivalent load of the wind turbine. The prediction unit may estimate the fatigue life of the wind turbine based on the equivalent load detected by the device.

In addition, the method according to the embodiments of the present disclosure may be implemented as a computer program stored in a computer-readable medium, and the method is performed when the computer program is executed.

In addition, various units in the apparatus and the device according to the embodiments of the present disclosure may be implemented as hardware components or software modules. Further, those skilled in the art may implement the various units with a field programmable gate array (FPGA), an application specific integrated circuit (ASIC), a processor or the like, according to the defined processing executed by the various units.

Based on the method and the device for detecting the equivalent load of the turbine according to the present disclosure, there is no need to arrange a sensor for each wind turbine, thus lowering a cost caused by arranging the sensor for each wind turbine. In addition, by detecting the ambient wind speed and the ambient wind direction in the each prediction period, the detection of the environment data is achieved, thereby detecting the equivalent load of the wind turbine precisely and further lowering the detection cost effectively.

Although the invention is illustrated and described with reference to the embodiments, those skilled in the art should understand that various modifications of formats and details of the present disclosure may be made without departing from the spirit and scope of the present disclosure defined by the claims.

The invention claimed is:

1. A method for detecting an equivalent load of a wind turbine, comprising:
   detecting environment data of each wind turbine of a plurality of wind turbines in a wind farm in each detection period;
   detecting a load of a calibration wind turbine in the plurality of wind turbines and calculating an equivalent load of the calibration wind turbine based on the detected load in the each detection period; and
   determining an equivalent load of the each wind turbine based on the detected environment data of the each wind turbine with a load estimation model in the each detection period,
   wherein the load estimation model represents a relation between the environment data and the equivalent load of the each wind turbine, and before the load estimation model is applied in the each detection period, a parameter of the load estimation model is calibrated based on the calculated equivalent load of the calibration wind turbine in a current detection period and the equivalent load of the calibration wind turbine determined with the load estimation model in a previous detection period.

2. The method according to claim 1, wherein the environment data of any of the wind turbines comprises at least one of effective turbulence intensity and wind farm influence information, the effective turbulence intensity indicates turbulence intensity directly experienced by an impeller of the any of the wind turbines, and the wind farm influence information indicates an influence factor of the any of the wind turbines by the wind farm.

3. The method according to claim 2, wherein the wind farm influence information comprises at least one of a wake superposition degree and a wake superposition number, the wake superposition number indicates the number of other wind turbines having influence on a wake of the any of the wind turbines, and the wake superposition degree indicates a degree of influence on the any of the wind turbines by wakes of the other wind turbines.

4. The method according to claim 3, wherein the wake superposition degree is acquired by calculating a ratio of an angle of an ambient wind direction to a sum of spread angles of wakes of other wind turbines located in an upwind direction of an ambient wind of the any of the wind turbines.

5. The method according to claim 4, wherein the wake superposition degree is a result of applying a regulation coefficient to the ratio, and the wake superposition number is a result of performing normalization on the number; and
wherein the regulation coefficient is a ratio of a first distance to a second distance, the first distance indicates a minimum distance from distances between the any of the wind turbines and the other wind turbines located in the upwind direction of the ambient wind of the any of the wind turbines, and the second distance indicates a maximum distance from the distances between the any of the wind turbines and the other wind turbines located in the upwind direction of the ambient wind of the any of the wind turbines.

6. The method according to claim 2, wherein detecting the effective turbulence intensity comprises:
calculating ambient turbulence and a thrust coefficient of the any of the wind turbines based on an ambient wind speed;
calculating intensity of turbulence caused by a wake of a nearby wind turbine based on the calculated thrust coefficient, the ambient wind speed, and a distance between the any of the wind turbines and the nearby wind turbine; and
generating the effective turbulence intensity by performing synthesis on the ambient turbulence and the calculated intensity of the turbulence, wherein the synthesis reflects respective influences of the ambient turbulence and the calculated intensity of the turbulence.

7. The method according to claim 6, wherein the effective turbulence intensity is a square root of a sum of a square of the ambient turbulence and a square of the calculated intensity of the turbulence; and the ambient turbulence is a ratio of a standard deviation of the ambient wind speed to a mean value of the ambient wind speed, or the ambient turbulence is acquired based on the ambient wind speed, an ambient wind direction, and historical meteorological data of a surrounding environment of the wind farm.

8. The method according to claim 6, wherein the nearby wind turbine is a wind turbine, from wind turbines located in an upwind direction of an ambient wind of the any of the wind turbines, which has a minimum distance from the any of the wind turbines, or a plurality of wind turbines located within a sector of the upwind direction of the ambient wind of the any of the wind turbines.

9. A method for estimating fatigue life of a wind turbine, comprising:
detecting an equivalent load of the wind turbine with the method according to claim 1; and
estimating the fatigue life of the wind turbine based on the detected equivalent load.

10. A computer-readable storage medium having a computer program stored therein, wherein the computer program, when being executed, performs the method according to claim 1.

11. A device for detecting an equivalent load of a wind turbine, comprising:
a first detecting unit, configured to detect environment data of each wind turbine of a plurality of wind turbines in a wind farm in each detection period;
a second detecting unit, configured to detect a load of a calibration wind turbine in the plurality of wind turbines, and calculate an equivalent load of the calibration wind turbine based on the detected load in the each detection period; and
an estimation unit, configured to determine an equivalent load of the each wind turbine based on the detected environment data of the each wind turbine with a load estimation model in the each detection period,
wherein the load estimation model represents a relation between the environment data and the equivalent load of the each wind turbine, and before the load estimation model is applied in the each detection period, the estimation unit calibrates a parameter of the load estimation model based on the calculated equivalent load of the calibration wind turbine in a current detection period and the equivalent load of the calibration wind turbine determined with the load estimation model in a previous detection period.

12. The device according to claim 11, wherein the environment data of any of the wind turbines comprises at least one of effective turbulence intensity and wind farm influence information, the effective turbulence intensity indicates turbulence intensity directly experienced by an impeller of the any of the wind turbines, and the wind farm influence information indicates an influence factor of the any of the wind turbines by the wind farm.

13. The device according to claim 12, wherein the wind farm influence information comprises at least one of a wake superposition degree and a wake superposition number, the wake superposition number indicates the number of other wind turbines having influence on a wake of the any of the wind turbines, and the wake superposition degree indicates a degree of influence on the any of the wind turbines by wakes of the other wind turbines.

14. The device according to claim 13, wherein the wake superposition degree is acquired by calculating a ratio of an angle of an ambient wind direction to a sum of spread angles of wakes of other wind turbines located in an upwind direction of an ambient wind of the any of the wind turbines.

15. The device according to claim 14, wherein the wake superposition degree is a result of applying a regulation coefficient to the ratio, and the wake superposition number is a result of performing normalization on the number; and
wherein the regulation coefficient is a ratio of a first distance to a second distance, the first distance indicates a minimum distance from distances between the any of the wind turbines and the other wind turbines located in the upwind direction of the ambient wind of the any of the wind turbines, and the second distance indicates a maximum distance from the distances between the any of the wind turbines and the other wind turbines located in the upwind direction of the ambient wind of the any of the wind turbines.

16. The device according to claim 12, wherein detecting the effective turbulence intensity by the first detecting unit comprises:

calculating ambient turbulence and a thrust coefficient of the any of the wind turbines based on an ambient wind speed;

calculating intensity of turbulence caused by a wake of a nearby wind turbine based on the calculated thrust coefficient, the ambient wind speed, and a distance between the any of the wind turbines and the nearby wind turbine; and generating the effective turbulence intensity by performing synthesis on the ambient turbulence and the calculated intensity of the turbulence, wherein the synthesis reflects respective influences of the ambient turbulence and the calculated intensity of the turbulence.

17. The device according to claim 16, wherein the effective turbulence intensity is a square root of a sum of a square of the ambient turbulence and a square of the calculated intensity of the turbulence; and the ambient turbulence is a ratio of a standard deviation of the ambient wind speed to a mean value of the ambient wind speed, or the ambient turbulence is acquired based on the ambient wind speed, an ambient wind direction, and historical meteorological data of a surrounding environment of the wind farm.

18. The device according to claim 16, wherein the nearby wind turbine is a wind turbine, from wind turbines located in an upwind direction of an ambient wind of the any of the wind turbines, which has a minimum distance from the any of the wind turbines, or a plurality of wind turbines located within a sector of the upwind direction of the ambient wind of the any of the wind turbines.

19. An apparatus for estimating fatigue life of a wind turbine, comprising:
the device according to claim 11, configured to detect an equivalent load of the wind turbine; and
a prediction unit, configured to estimate the fatigue life of the wind turbine based on the equivalent load detected by the device.

* * * * *